（12）United States Patent
An

(10) Patent No.: US 10,607,706 B2
(45) Date of Patent: Mar. 31, 2020

(54) MEMORY SYSTEM AND OPERATING METHOD THEREOF

(71) Applicant: SK hynix Inc., Gyeonggi-do (KR)

(72) Inventor: Chi Wook An, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 71 days.

(21) Appl. No.: 16/117,335

(22) Filed: Aug. 30, 2018

(65) Prior Publication Data

US 2019/0214093 A1 Jul. 11, 2019

(30) Foreign Application Priority Data

Jan. 8, 2018 (KR) .................. 10-2018-0002351

(51) Int. Cl.
*G11C 7/00* (2006.01)
*G11C 16/26* (2006.01)
*G11C 16/04* (2006.01)
*G11C 16/32* (2006.01)
*G06F 3/06* (2006.01)
*G11C 11/56* (2006.01)

(52) U.S. Cl.
CPC ............ *G11C 16/26* (2013.01); *G06F 3/0604* (2013.01); *G06F 3/0659* (2013.01); *G06F 3/0679* (2013.01); *G11C 16/0466* (2013.01); *G11C 16/32* (2013.01); *G11C 11/5671* (2013.01)

(58) Field of Classification Search
CPC ....... G11C 7/1051; G11C 7/22; G11C 7/1072; G11C 7/1006; G11C 7/1066
USPC .......................... 365/189.15, 189.14, 230.03
See application file for complete search history.

(56) References Cited

U.S. PATENT DOCUMENTS 9,355,715 B1 * 5/2016 Kim .................... G11C 11/5642
9,502,125 B2 * 11/2016 Moschiano ............ G11C 16/26

FOREIGN PATENT DOCUMENTS

KR   1020160050392   5/2016
KR   1020170092006   8/2017

\* cited by examiner

*Primary Examiner* — Son T Dinh
(74) *Attorney, Agent, or Firm* — IP & T Group LLP

(57) ABSTRACT

There are provided a memory system and an operating method thereof. A memory system includes: a memory device including a plurality of memory blocks configured with a plurality of pages, the memory device performing a read operation in units of pages; and a memory controller configured to control the memory device to perform the read operation, wherein the memory device is controlled such that a first initial turn-on time of a turn-on voltage for a first selected page among the plurality of pages and a second turn-on time of the turn-on voltage for subsequently selected pages are different from each other.

20 Claims, 9 Drawing Sheets

MEMORY SYSTEM AND OPERATING METHOD THEREOF

CROSS-REFERENCE TO RELATED APPLICATION

The present application claims priority under 35 U.S.C. § 119(a) to Korean patent application number 10-2018-0002351, filed on Jan. 8, 2018, which is incorporated herein by reference in its entirety.

BACKGROUND

1. Field of Invention

Various embodiments of the present disclosure generally relate to a memory system and an operating method thereof. Particularly, the embodiments relate to a memory system capable of preventing a read disturb phenomenon of a memory device for storing data and an operating method of the memory system.

2. Description of the Related Art

The paradigm on recent computer environment has shifted to ubiquitous computing which enables computing systems to be used anywhere and anytime. As a result, the use of portable electronic devices such as mobile phones, digital cameras, notebook computers, and the like has increased. Such portable electronic devices may generally include a memory system using a memory device, i.e., a data storage device. The data storage device may be used as a main memory device or an auxiliary memory device of the portable electronic devices.

A data storage device as a memory device has excellent stability and durability, high information access speed, and low power consumption, since there is no mechanical driving part. Examples of data storage devices having such advantages include a Universal Serial Bus (USB) memory device, memory cards having various interfaces, a Solid State Drive (SSD), and the like.

SUMMARY

Embodiments provide a memory system capable of improving electrical characteristics by effectively removing holes remaining in a channel of a selected memory block in a read operation, and an operating method of the memory system.

According to an aspect of the present disclosure, there is provided a memory system including: a memory device including a plurality of memory blocks configured with a plurality of pages, the memory device performing a read operation in units of pages; and a memory controller configured to control the memory device to perform the read operation, wherein the memory device is controlled such that a first initial turn-on time of a turn-on voltage for a first selected page among the plurality of pages and a second turn-on time of the turn-on voltage for subsequently selected pages are different from each other.

According to an aspect of the present disclosure, there is provided a memory system including: a memory device including a plurality of pages; and a memory controller configured to control the memory device to perform a read operation in response to a request from a host, wherein the memory device performs the read operation such that an initial turn-on time of a first selected page among the plurality of pages is longer than that of subsequently selected pages.

According to an aspect of the present disclosure, there is provided a method for operating a memory system, the method including: selecting a memory block on which a read operation is to be performed and one page among a plurality of pages in the memory block; when the selected page is a first selected page, setting an initial turn-on time to a first time; when the selected page is a subsequently selected page, setting the initial turn-on time to a second time; and applying a turn-on voltage to the selected page for the first or the second time.

According to an aspect of the present disclosure, there is provided a memory system including: a memory device including a memory block having a plurality of pages; and a controller configured to control the memory device to perform a read operation to the memory block in units of pages, wherein the memory device applies, during the read operation, a turn-on voltage to the memory block while reading a first selected page, among the plurality of pages, for a longer time than while reading subsequently selected pages, among the plurality of pages.

BRIEF DESCRIPTION OF THE DRAWINGS

Various embodiments will now be described in more detail hereinafter with reference to the accompanying drawings; however, elements and features of the present invention may be configured or arranged differently than shown and described herein. Thus, the present invention is not limited to the embodiments set forth herein. Rather, these embodiments are provided so that this disclosure is thorough and complete and fully conveys the scope of the embodiments to those skilled in the art.

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, embodiments of the present disclosure have been shown and described, simply by way of illustration. As those skilled in the art would realize, the described embodiments may be modified in different ways, all without departing from the spirit or scope of the present disclosure. Accordingly, the drawings and description are to be regarded as illustrative in nature and not restrictive. Throughout the disclosure, reference to "an embodiment" or the like is not necessarily to only one embodiment, and different references to "an embodiment" or the like are not necessarily to the same embodiment(s).

In the entire specification, when an element is referred to as being "connected" or "coupled" to another element, it can be directly connected or coupled to the another element or be indirectly connected or coupled to the another element with one or more intervening elements interposed. In addition, when an element is referred to as "including" one or more stated components, this indicates that the element may further include one or more unstated components, unless the context clearly indicates otherwise.

Figure 1:
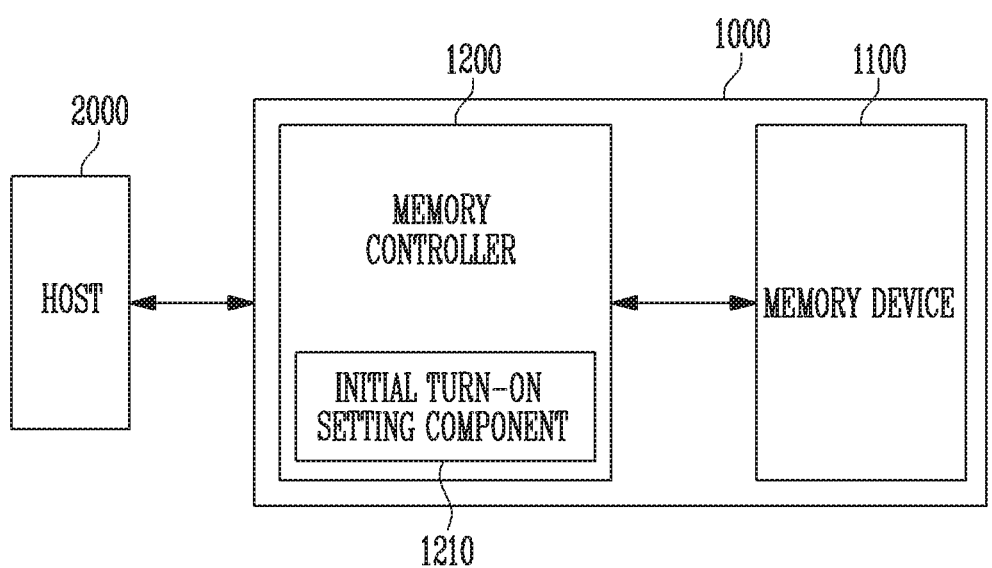
FIG. 1 is a diagram illustrating a memory system according to an embodiment of the present disclosure.

FIG. 1 is a diagram illustrating a memory system according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between the host 2000 and the memory system 1000 are not limited to the above-described examples, and may be one of other interface protocols such as a Universal Serial Bus (USB), a Multi-Media Card (MMC), an Enhanced Small Disk Interface (ESDI), and Integrated Drive Electronics (IDE).

The memory controller 1200 may control overall operations of the memory system 1000, and control data exchange between the host 2000 and the memory device 1100. For example, the memory controller 1200 may program or read data by controlling the memory device 1100 in response to a request from the host 2000. Also, the memory controller 1200 may store information of main memory blocks and sub-memory blocks, which are in the memory device 1100, and select the memory device 1100 to perform a program operation on a main memory block or a sub-memory block according to the amount of data loaded for the program operation. In some embodiments, the memory device 1100 may include a Double Data Rate Synchronous Dynamic Random Access Memory (DDR SDRAM), a Low Power Double Data Rate 4 (LPDDR4) SDRAM, a Graphics Double Data Rate (DDDR) SRAM, a Low Power DDR (LPDDR), a Rambus Dynamic Random Access Memory (RDRAM), and/or a flash memory.

The memory controller 1200 may be configured to include an initial turn-on setting component 1210. When a read command is received from the host 2000, the initial turn-on setting component 1210 may set initial turn-on times of a selected memory block on which a read operation is to be performed among a plurality of memory blocks in the memory device 1100 according to a read order of selected pages. For example, the initial turn-on setting component 1210 may set, to a first initial turn-on time in a read operation of a first selected page during the read operation of the selected memory block, and set, a second initial turn-on time in a read operation of the other pages. The first time is preferably longer than the second time. The turn-on setting component 1210 may have sections, one for each of the first and second initial turn-on times, that may be set to the first and second initial turn-on times respectively. The initial turn-on setting component 1210 sets the above-described first initial turn-on time, and controls the memory device 1100 to remove hot holes remaining in a channel of the selected memory block by applying a turn-on voltage to word lines and select lines of the selected memory block during the first initial turn-on time.

The memory device 1100 may perform a program, read or erase operation under the control of the memory controller 1200.

Figure 2:
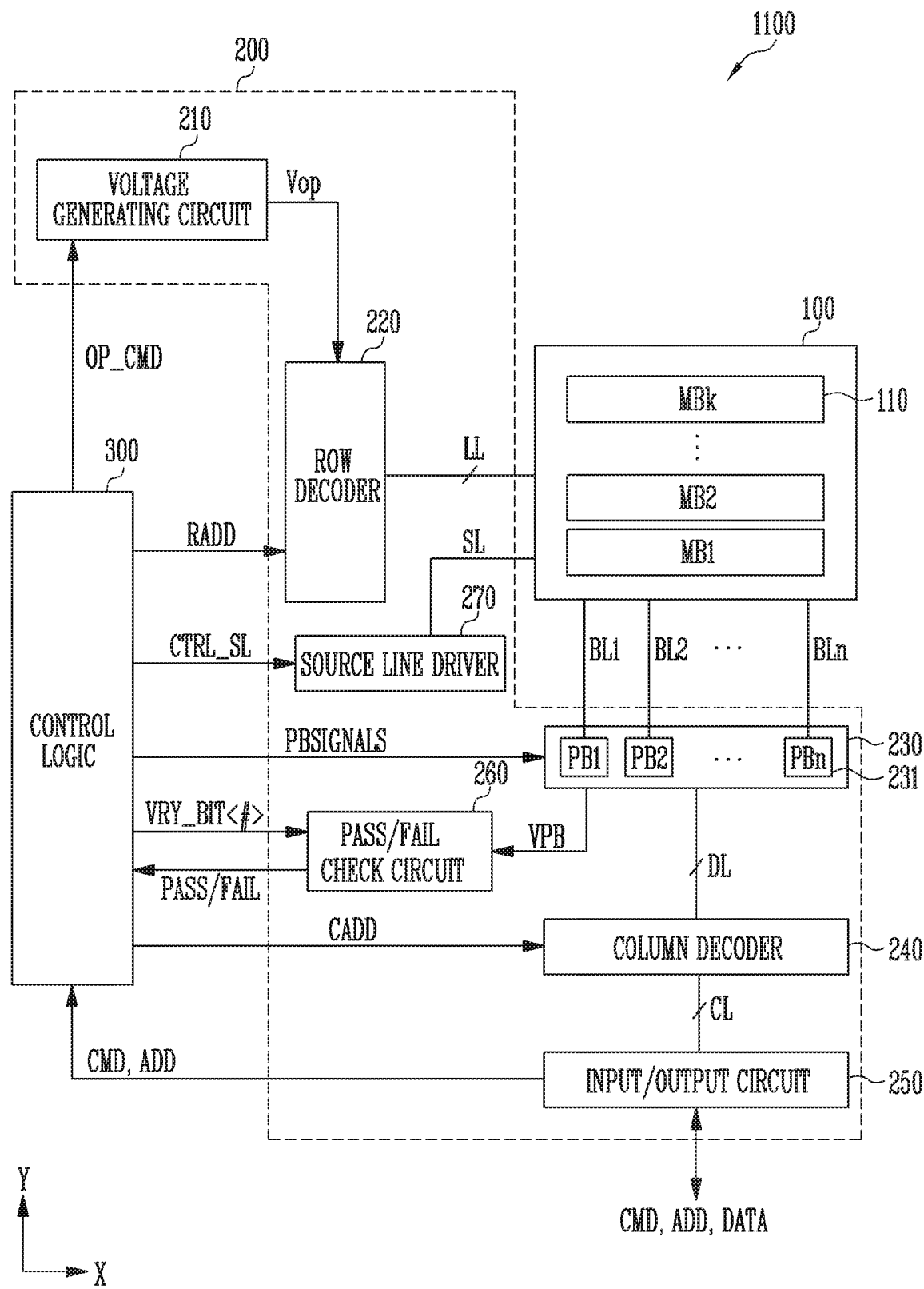
FIG. 2 is a diagram illustrating an exemplary memory device of FIG. 1.

FIG. 2 is a diagram illustrating the memory device of FIG. 1.

Referring to FIG. 2, the memory device 1110 may include a memory cell array 100 that stores data. The memory device 1110 may include peripheral circuits 200 configured to perform a program operation for storing data in the memory cell array 100, a read operation for outputting the stored data, and an erase operation for erasing the stored data. The memory device 1110 may include a control logic 300 that controls the peripheral circuits 200 under the control of the memory controller (1200 of FIG. 1).

The memory cell array 100 may include a plurality of memory blocks MB1 to MBk (k is a positive integer) 110. Local lines LL and bit lines BL1 to BLn (n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. Here, the first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuits 200 may be configured to perform program, read, and erase operations of a selected memory block 110 under the control of the control logic 300. For example, the peripheral circuits 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a turn-on voltage, a read voltage, an erase voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the memory controller (1200 of FIG. 1), to the control logic 300, or communicate data DATA with the column decoder 240.

In a read operation and a verify operation, the pass/fail check circuit 260 may generate a reference current in response to a permission bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell in the memory cell array 100 through a source line SL, and control the voltage of a source node. As an example, in a read or verify operation, the source line driver 270 may electrically couple a source node of the memory cell to a ground node. Also, in a program operation, the source line driver 270 may apply a ground voltage to the source node of the memory cell. In an erase operation, the source line driver 270 may apply an erase voltage to the source node of the memory cell. The source line driver 270 may receive a source line control signal CTRL_SL from the control logic 300, and control the voltage of the source node, based on the source line control signal CTRL_SL.

The control logic 300 may control the peripheral circuits 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

The memory device 1100 according to an embodiment of the present disclosure performs a read operation to a selected memory block by sequentially selecting and reading a plurality of pages in units of pages. The memory device 1100 performs a read operation on a first selected page by setting an initial turn-on time to a first time and performs a read operation on subsequently selected pages by setting initial turn-on time to a second time shorter than the first time under the control of the initial turn-on setting component 1210 of FIG. 1.

Figure 3:
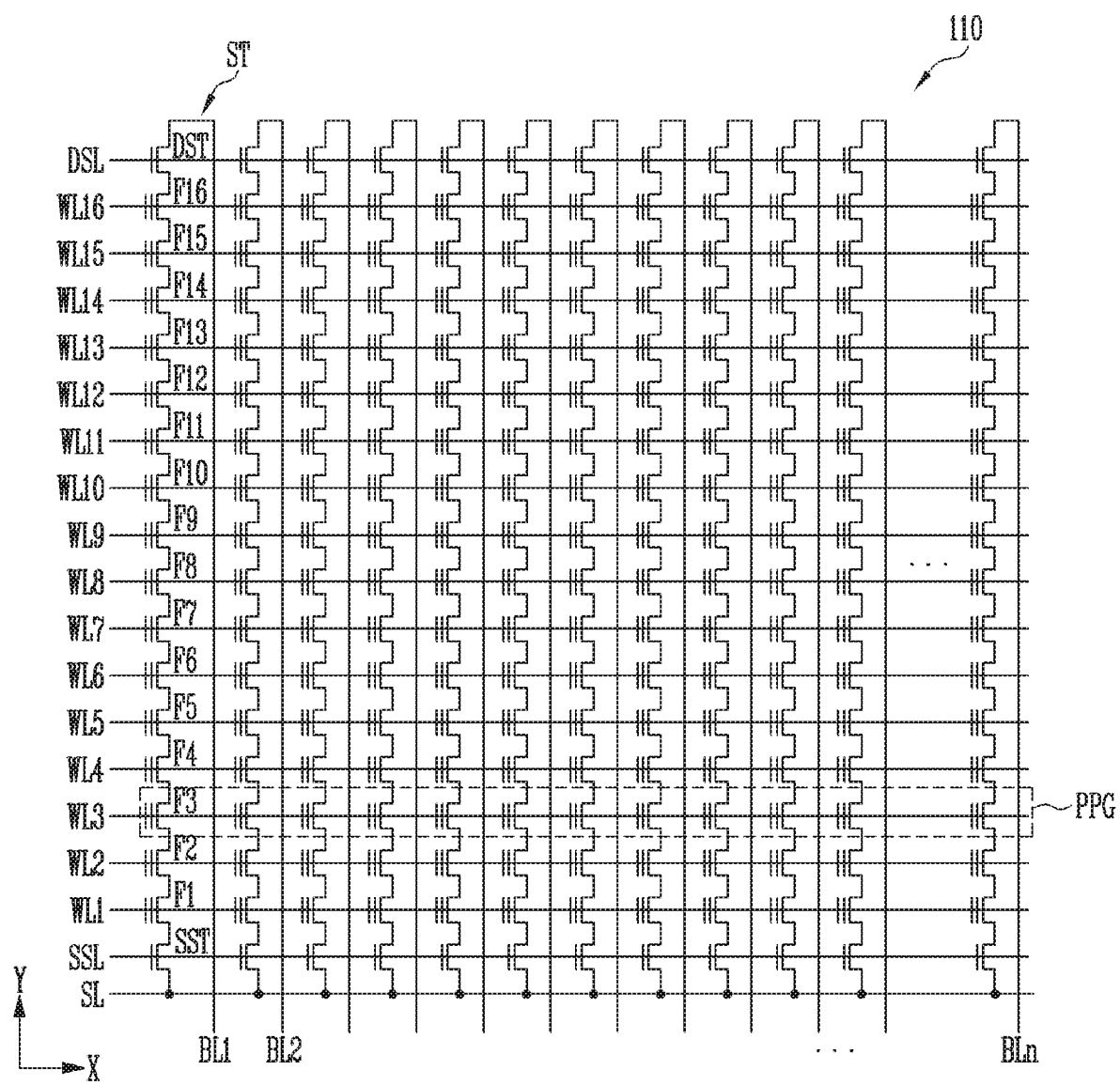
FIG. 3 is a diagram illustrating an exemplary memory block of FIG. 2.

FIG. 3 is a diagram illustrating an exemplary memory block of FIG. 2.

Referring to FIG. 3, in the memory block 110, a plurality of word lines arranged in parallel may be coupled between a first select line and a second select line. Here, the first select line may be a source select line SSL, and the second select line may be a drain select line DSL. More specifically, the memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells, e.g., F1 to F16, and a drain select transistor DST, which are coupled in series to each other between the source line SL and the first bit line BL1. At least one source select transistor SST and at least one drain select transistor DST may be included in one string ST, which may include more than the 16 memory cells F1 to F16 shown in the drawing.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST in different strings ST may be coupled to the source select line SSL, gates of drain select transistors DST in different strings ST may be coupled to the drain select line DSL, gates of the memory cells F1 to F16 in different strings ST may be coupled to a plurality of word lines WL1 to WL16. A group of memory cells in different strings ST coupled to the same word line may be a physical page PPG. Therefore, physical pages PPG respectively corresponding to the word lines WL1 to WL16 may be included in the memory block 110.

One memory cell (each of F1 to F16) may store data of one bit. This is generally called as a single level cell (SLC). In this case, one physical page PPG may store one logical page (LPG) data. The one LPG data may include data bits, the number of which corresponds to that of cells in one physical page PPG. In addition, one memory cell may store data of two or more bits. This is generally called as a multi-level cell. In this case, one physical page PPG may store two or more LPG data.

Figure 4:
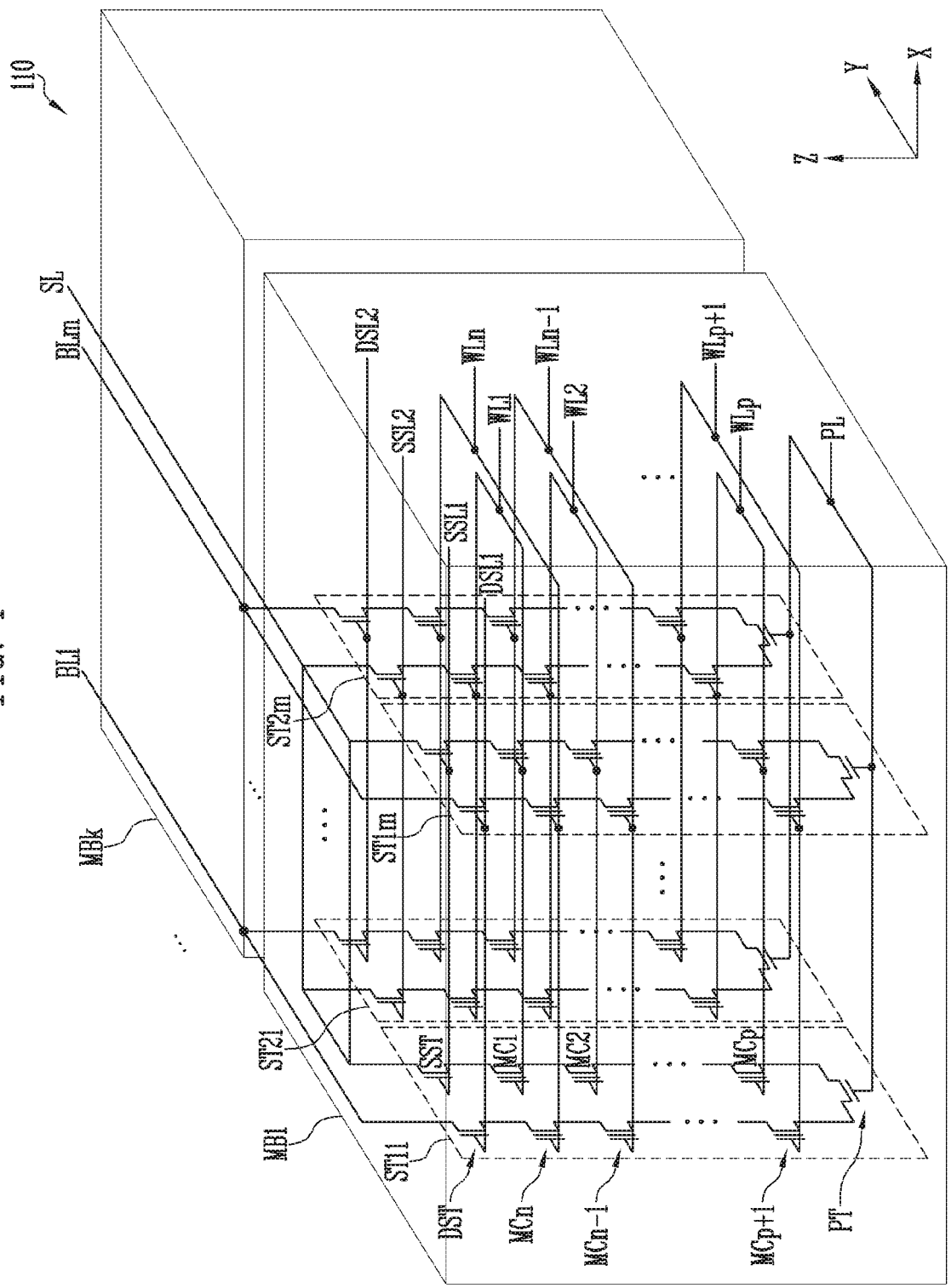
FIG. 4 is a diagram illustrating an embodiment of a three-dimensionally configured memory block.

FIG. 4 is a diagram illustrating an embodiment of a three-dimensionally configured memory block.

Referring to FIG. 4, the memory cell array 100 may include a plurality of memory blocks MB1 to MBk 110. The memory block 110 may include a plurality of strings ST11 to ST1*m* and ST21 to ST2*m*. In an embodiment, each of the plurality of strings ST11 to ST1*m* and ST21 to ST2*m* may be formed in a 'U' shape. In the memory block 110, m strings may be arranged in a row direction (X direction). In FIG. 4, it is illustrated that two strings are arranged in a column direction (Y direction). However, this is for clarity; three or more strings may be arranged in the column direction (Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, source select transistors of strings ST11 to ST1m of a first row may be coupled to a first source select line SSL1. Source select transistors of strings ST21 to ST2m of a second row may be coupled to a second source select line SSL2.

In another embodiment, the source select transistors of the strings ST11 to ST1m and ST21 to ST2m may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be coupled in series to each other between the source select transistor SST and the pipe transistor PT. The (p+1)th to nth memory cells MCp+1 to MCn may be sequentially arranged in the vertical direction (Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1, of the first row may be coupled to a first drain select line DSL1. Drain select transistors of the strings ST21 to ST2m of the second row may be coupled to a second drain select line DSL2.

Strings arranged in the column direction may be coupled to bit lines extending in the column direction. In FIG. 4, strings ST11 and ST21 of a first column may be coupled to a first bit line BL1. Strings ST1m and ST2m of an mth column may be coupled to an nth bit line BLn.

Memory cells coupled to the same word line among the strings arranged in the row direction may constitute one page. For example, memory cells coupled to the first word line WL1 among the strings ST11 to ST1m of the first row may constitute one page. Memory cells coupled to the first word line WL1 among the strings ST21 to ST2m of the second row may constitute another page. As any one of the drain select lines DSL1 and DSL2 is selected, strings arranged in one row direction may be selected. As any one of the word lines WL1 to WLn is selected, one page among the selected strings may be selected.

Figure 5:
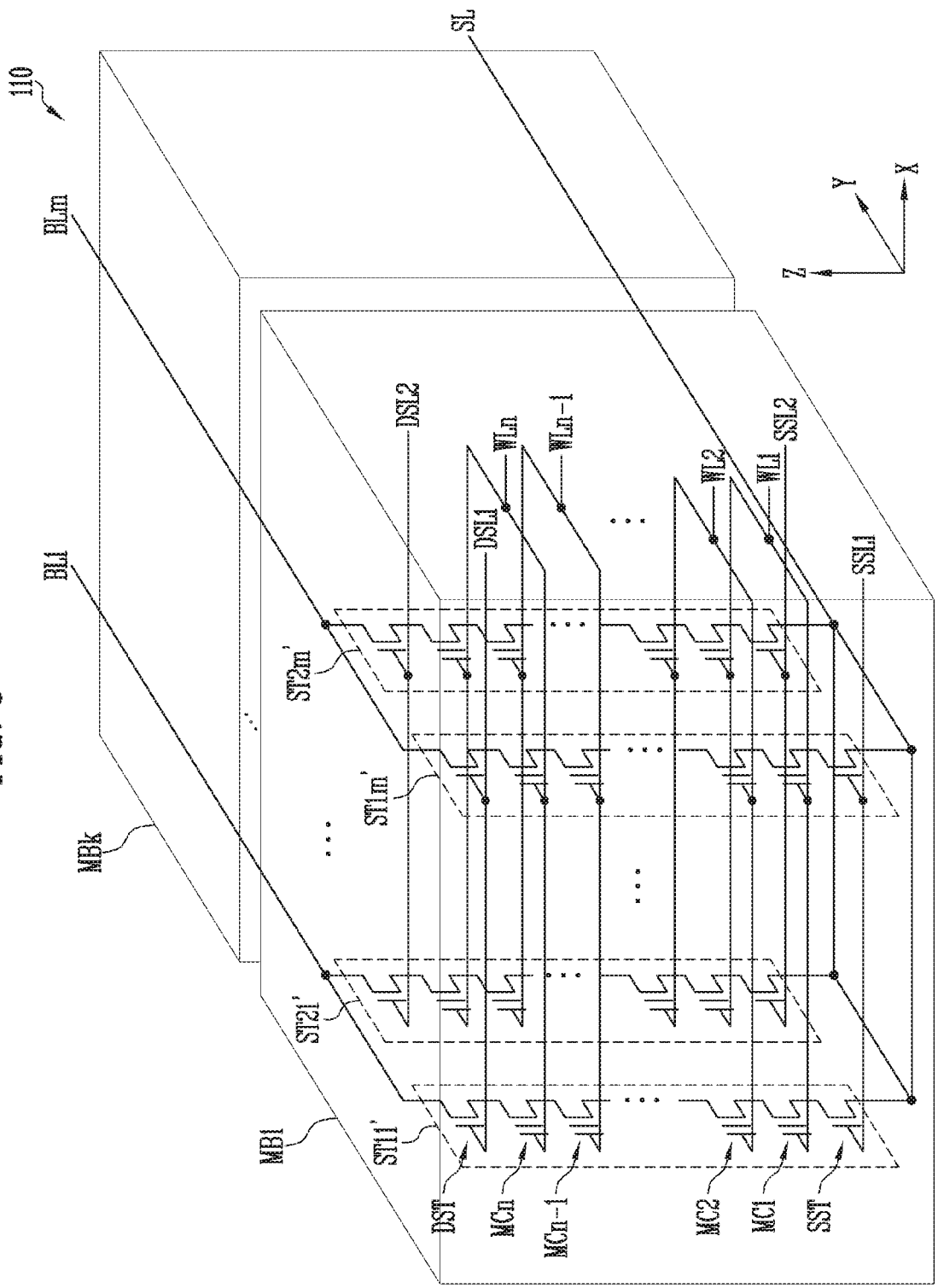
FIG. 5 is a diagram illustrating another embodiment of the three-dimensionally configured memory block.

FIG. 5 is a diagram illustrating another embodiment of a three-dimensionally configured memory block.

Referring to FIG. 5, the memory cell array 100 may include a plurality of memory blocks MB1 to MBk 110. The memory block 110 may include a plurality of strings ST11' to ST1m' and ST21' to ST2m'. Each of the plurality of strings ST11' to ST1m' and ST21' to ST2m' may extend along a vertical direction (Z direction). In the memory block 110, strings may be arranged in a row direction (X direction). In FIG. 5, it is illustrated that two strings are arranged in a column direction (Y direction). However, this is for clarity; three or more strings may be arranged in the column direction (Y direction).

Each of the plurality of strings ST11' to ST1m' and ST21' to ST2m' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1m' arranged on a first row may be coupled to a first source select line SSL1. Source select transistors of strings ST21' to ST2m' arranged on a second row may be coupled to a second source select line SSL2. In another embodiment, the source select transistors of the strings ST11' to ST1m' and ST21" to ST2m' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 110 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1m' of the first row may be coupled to a first drain select line DSL1. The drain select transistors DST of the strings ST21' to ST2m' of the second row may be coupled to a second drain select line DSL2.

That is, the memory block 110 of FIG. 5 may have a circuit similar or equivalent to that of the memory block 110 of FIG. 4, except that the pipe transistor PT is excluded from each string.

The plurality of memory blocks MB1 to MBk 110 described in FIGS. 4 and 5 may share the source line SL. Therefore, hot holes may be introduced into a channel of an unselected memory block by an erase voltage applied to the source line SL in an erase operation of a selected memory block among the plurality of memory blocks MB1 to MBk 110.

Figure 6:
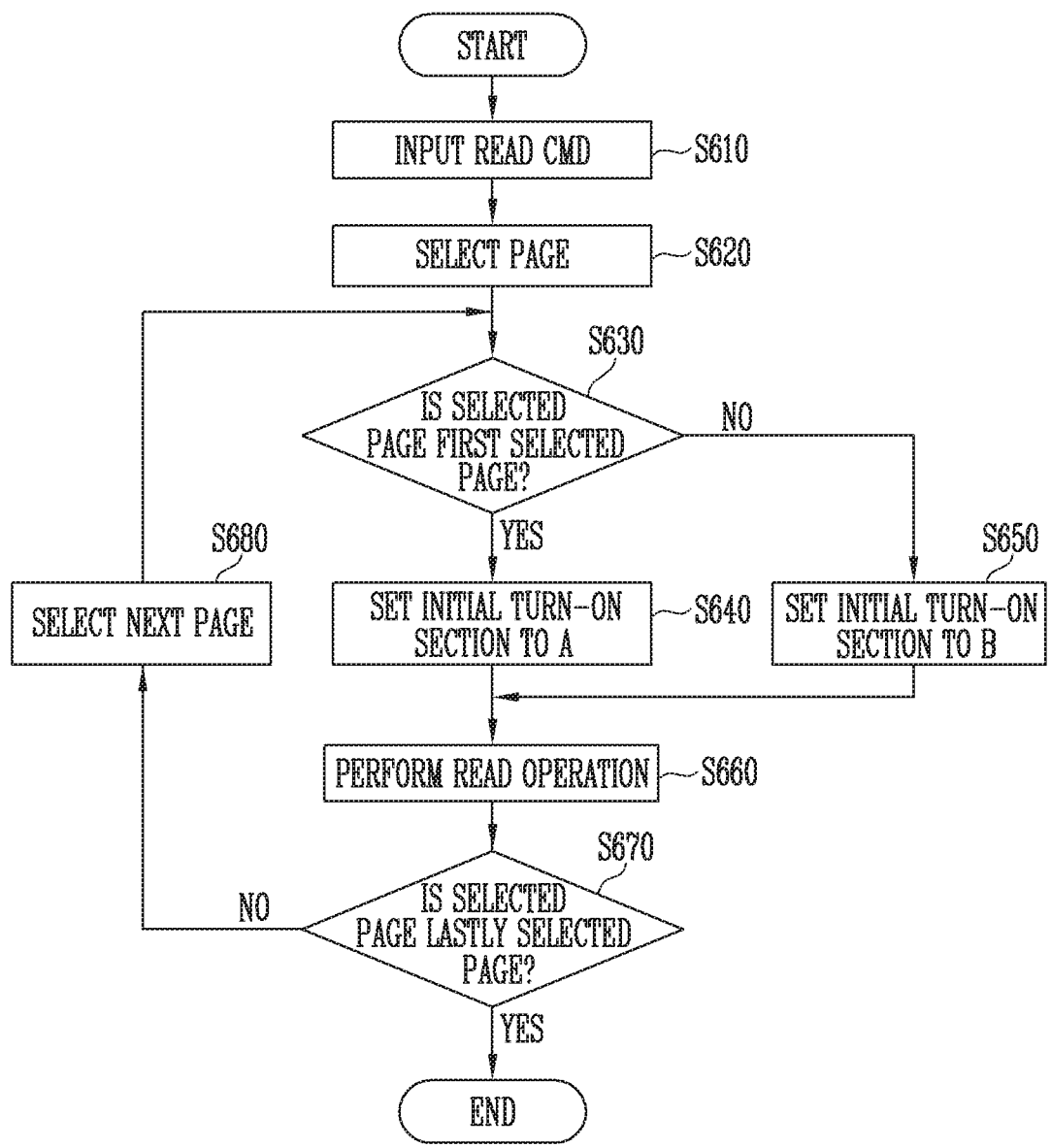
FIG. 6 is a flowchart illustrating a read operation of the memory system according to an embodiment of the present disclosure.

FIG. 6 is a flowchart illustrating a read operation of the memory system according to an embodiment of the present disclosure.

Figure 7:
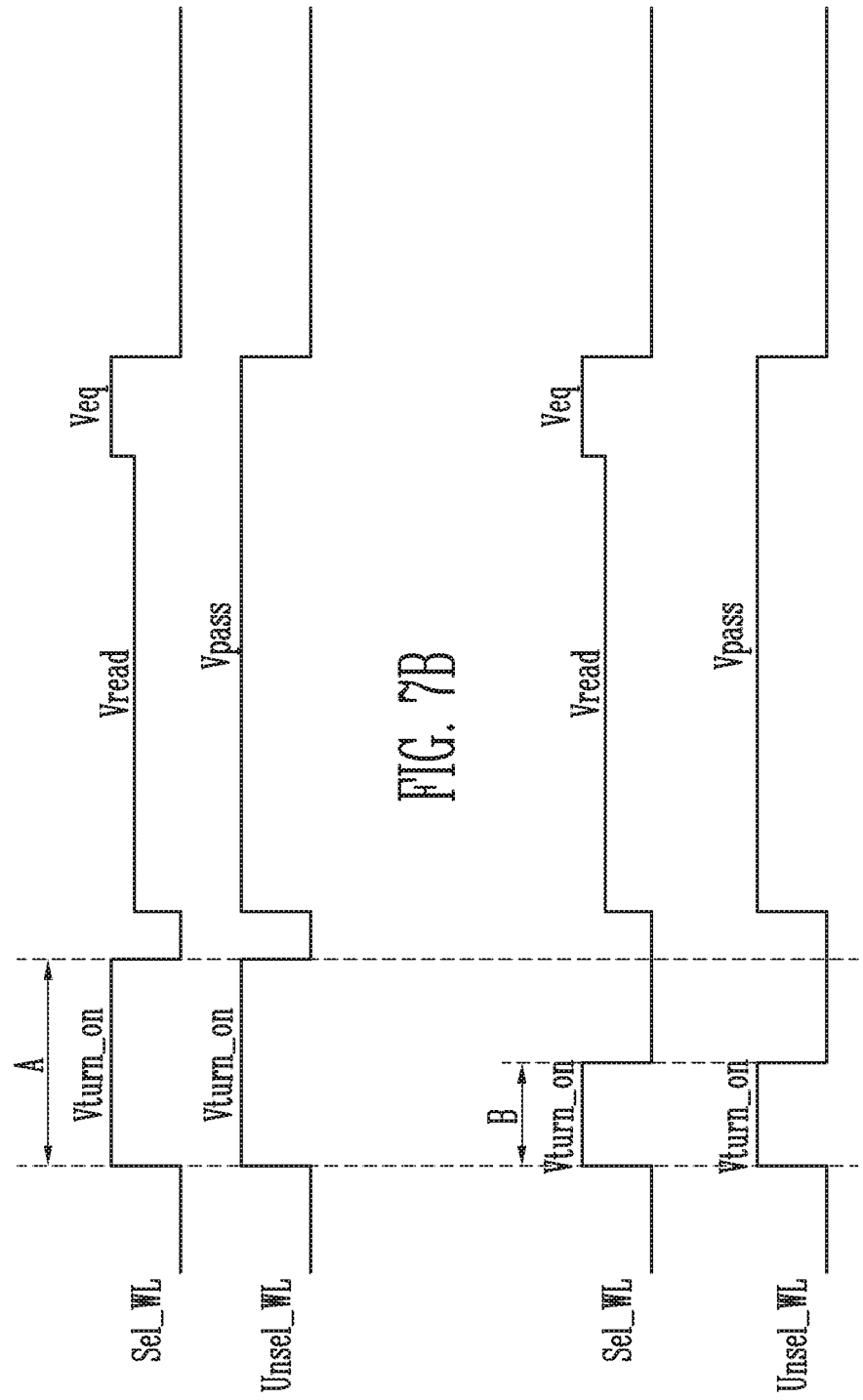
FIGS. 7A and 7B are voltage waveform diagrams illustrating a read operation of the memory system according to an embodiment of the present disclosure.

FIGS. 7A and 7B are voltage waveform diagrams illustrating a read operation of the memory system according to an embodiment of the present disclosure.

The read operation of the memory system according to an embodiment of the present disclosure will be described as follows with reference to FIGS. 1 to 7.

1) Input Read Command (step S610)

If a read command Read CMD is input from the host 2000, the memory controller 1200 generates a command CMD for controlling a read operation of the memory device 1100 in response to the read command Read CMD, and generates a translated address ADD by translating an address received together with the read command Read CMD to an address of the memory device 1100.

2) Select Page (step S620)

The memory device 1100 selects one (e.g., MB1) among the plurality of memory blocks MB1 to MBk 110 in response to the command CMD and the address ADD, which are received from the memory controller 1200, and selects a page on which a first read operation of the selected memory block is to be performed. In the read operation, the memory device 1100 performs the read operation by sequentially selecting a plurality of pages in the selected memory block. The page selected in a first read operation may be a physical page PPG adjacent to the source select line SSL or a physical page PPG adjacent to the drain select line DSL. Also, in the read operation, the memory device 1100 may perform the read operation by randomly selecting the plurality of pages in the selected memory block.

3) Determiner Whether Selected Page is First Page (step S630)

The initial turn-on setting component 1210 of the memory controller 1200 determines whether a currently selected page is first selected in the read operation.

4) Set Initial Turn-On Section to A, e.g., Set Initial Turn-On Time to A (step S640)

When the currently selected page is the first selected page, as determined in step S630 ("YES"), the initial turn-on setting component 1210 sets an initial turn-on section during a current read operation in units of pages to a first initial turn-on time A as shown in FIG. 7A.

5) Set Initial Turn-On Section to B, e.g., Set Initial Turn-On Time to B (Step S650)

When the currently selected page is not the first selected page, as determined in step S630 ("NO"), the initial turn-on setting component 1210 sets an initial turn-on section during the current read operation in units of pages to a second initial turn-on time B as shown in FIG. 7B. The second initial turn-on time B is preferably shorter than the first initial turn-on time A.

6) Perform Read Operation at Step S660

If the initial turn-on time is set in the step S640 or S650, the read operation on the selected page of the selected memory block is performed.

The voltage generating circuit 210 generates and outputs a turn-on voltage Vturn_on during the initial turn-on time set by the initial turn-on setting component 1210 in response to the operation signal OP_CMD, and the row decoder 220 applies the turn-on voltage Vturn_on generated by the voltage generating circuit 210 to the source select line SSL, the drain select line DSL, and all of the word lines WL1 to WL16 of the selected memory block MB1. Accordingly, the source select transistor SST, the plurality of memory cells F1 to F16, and the drain select transistor DST of the selected memory block MB1 are turned on, and the channel of the selected memory block MB1 is electrically coupled to the source line SL having a ground voltage level, so that hot holes in the channel of the selected memory block MB1 are removed.

After the initial turn-on time, the voltage generating circuit 210 generates a read voltage Vread and a pass voltage Vpass in response to the operation signal OP_CMD. The row decoder 220 applies the read voltage Vread generated by the voltage generating circuit 210 to a selected word line Sel_WL among the plurality of word lines, and applies the pass voltage Vpass generated by the voltage generating circuit 210 to an unselected word line Unsel_WL among the plurality of word lines.

The plurality of page buffers PB1 to PBn 231 of the page buffer group 230 senses and temporarily stores data programmed in memory cells in the selected page by sensing potential levels or current amounts of corresponding bit lines BL1 to BLn while the read voltage Vread is being applied. The temporarily stored data is output to the memory controller 1200 through the column decoder 240 and the input/output circuit 250.

After the read voltage Vread is applied for a certain time, the voltage generating circuit 210 generates an equalizing voltage Veq in response to the operation signal OP_CMD. The row decoder 220 applies the equalizing voltage Veq generated by the voltage generating circuit 210 to the selected word line Sel_WL and then discharges the selected word line Sel_WL and the unselected word line Unsel_WL to a low level after a certain time elapses.

The equalizing voltage Veq may have the same potential level as the pass voltage Vpass. Accordingly, since the selected word line Sel_WL and the unselected word line Unsel_WL are discharged at the same potential level, the selected word line Sel_WL and the unselected word line Unsel_WL can be discharged at the same level for the same discharge time.

7) Determine Whether Selected Page is Last Page (step S670)

If the read operation of the selected page is completed in the step S660, it is determined whether the selected page is last selected in the read operation of the selected memory block. If so, ("YES" at step S670), the read operation is ended.

8) Select Next Page (step S680)

When the previously selected page is not the last selected page, as determined in step S670 ("NO"), a next page of the currently selected memory block is selected, and the read operation is performed on the next page from the step S630.

According to an embodiment of the present disclosure, the read operation is performed with an initial turn-on time set relatively long for only the first selected page in the read operation of the selected memory block, so that it is possible to effectively remove hot holes in the channel of the selected memory block during the initial turn-on section in the read operation of the first selected page. In the read operation of the other pages, an initial turn-on time is set relatively short, so that the total time of the read operation can be reduced.

Figure 8:
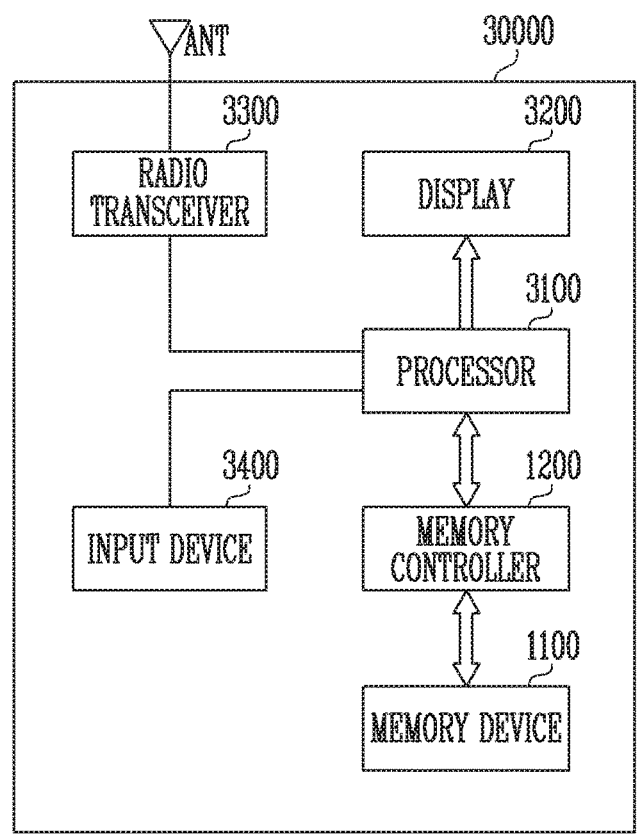
FIG. 8 is a diagram illustrating another embodiment of the memory system including the memory device shown in FIG. 2.

FIG. 8 is a diagram illustrating an embodiment of the memory system including the memory device shown in FIG. 2.

Referring to FIG. 8, the memory system 30000 may be implemented in a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the semiconductor memory device 1100. Also, the radio transceiver 3300 may convert a signal output from the processor 3100 into a radio signal, and output the converted radio signal to an external device through the antenna ANT. An input device 3400 is capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 9:
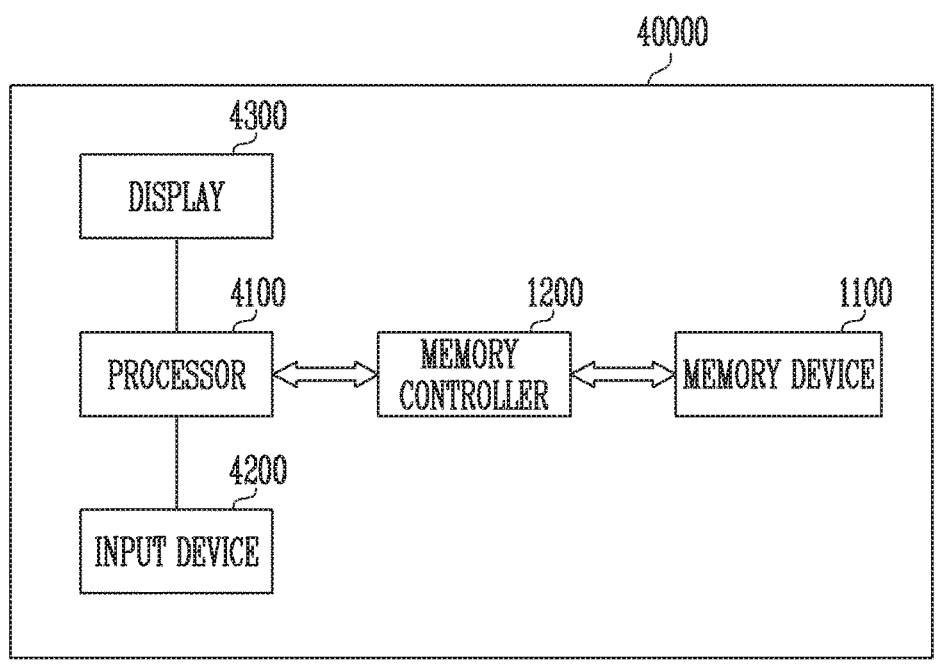
FIG. 9 is a diagram illustrating another embodiment of the memory system including the memory device shown in FIG. 2.

FIG. 9 is a diagram illustrating another embodiment of the memory system including the memory device shown in FIG. 2.

Referring to FIG. 9, the memory system 40000 may be implemented in a personal computer (PC), a tablet PC, a net-book, an e-reader, a personal digital assistant (PDA), a portable multimedia player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 10:
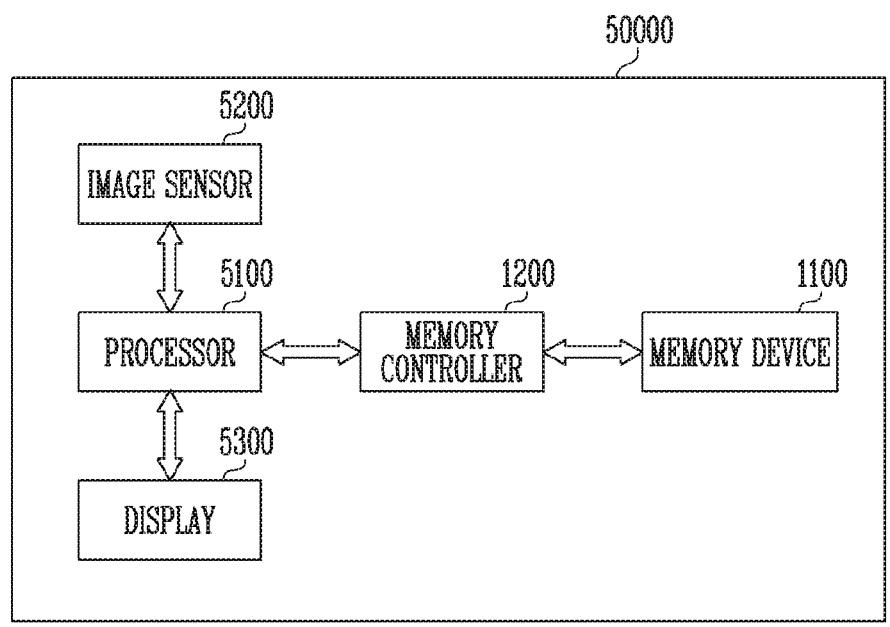
FIG. 10 is a diagram illustrating another embodiment of the memory system including the memory device shown in FIG. 2.

FIG. 10 is a diagram illustrating another embodiment of the memory system including the memory device shown in FIG. 2.

Referring to FIG. 10, the memory system 50000 may be implemented in an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 11:
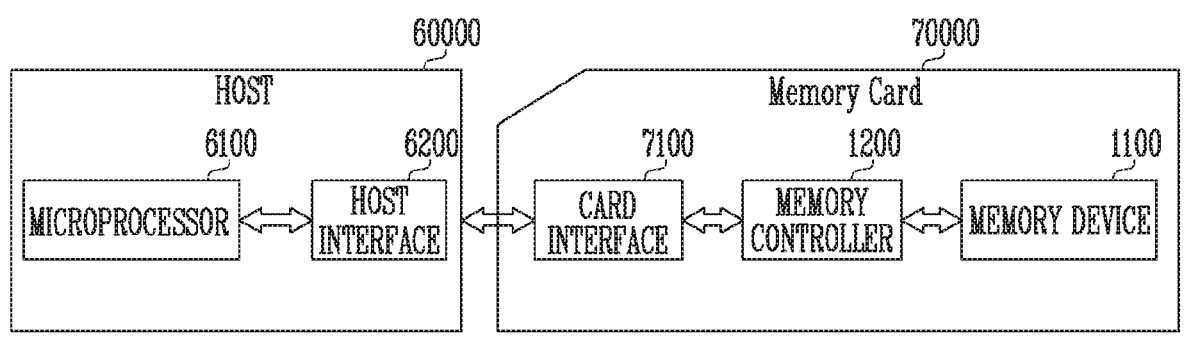
FIG. 11 is a diagram illustrating another embodiment of the memory system including the memory device shown in FIG. 2.

FIG. 11 is a diagram illustrating another embodiment of the memory system including the memory device shown in FIG. 2.

Referring to FIG. 11, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. Here, the card interface 7100 may include hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellularphone, console video game hardware, or a digital set-top box, the host interface 6200 may perform data communication with the memory device 1100 through the card interface 7100 and the memory controller 1200 under the control of a microprocessor 6100.

According to embodiments of the present disclosure, holes remaining in a channel of a selected memory block are effectively removed by controlling an initial turn-on section in a read operation of a first selected page among a plurality of pages, so that electrical characteristics can be improved.

Various embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
    a memory device including a plurality of memory blocks configured with a plurality of pages, the memory device performing a read operation in units of pages; and
    a memory controller configured to control the memory device to perform the read operation, wherein the memory device is controlled such that a first initial turn-on time of a turn-on voltage for a first selected page among the plurality of pages and a second turn-on time of the turn-on voltage for subsequently selected pages are different from each other.

2. The memory system of claim 1, wherein the first initial turn-on time is longer than the second initial turn-on time.

3. The memory system of claim 1, wherein, before a read voltage is applied to a selected memory block among the plurality of memory blocks in a read operation on the first selected page of the selected memory block, the turn-on voltage is applied to all word lines and select lines of the selected memory block for the first initial turn-on time.

4. The memory system of claim 3, wherein, before the read voltage is applied to one of the subsequently selected pages of the selected memory block, the turn-on voltage is applied to all of the word lines and select lines of the selected memory block for the second initial turn-on time.

5. The memory system of claim 1, wherein the memory controller includes an initial turn-on setting component configured to control initial turn-on times.

6. The memory system of claim 5, wherein the initial turn-on setting component:
    when a selected page in the read operation is the first selected page, sets an initial turn-on time as the first initial turn-on time; and
    when the selected page is one of the subsequently selected pages, sets the initial turn-on time as the second initial turn-on time.

7. The memory system of claim 1, wherein, in the read operation, a channel of a selected memory block among the plurality of memory blocks is electrically coupled to a source line by the turn-on voltage applied to word lines and select lines of the selected memory block in the first initial turn-on time and the second initial turn-on time.

8. A memory system comprising:
    a memory device including a plurality of pages; and
    a memory controller configured to control the memory device to perform a read operation in response to a request from a host,
    wherein the memory device performs the read operation such that an initial turn-on time of a first selected page among the plurality of pages is longer than that of subsequently selected pages.

9. The memory system of claim 8, wherein, in the read operation, the memory device performs the read operation in units of pages by sequentially selecting the plurality of pages.

10. The memory system of claim 8, wherein the memory device sets the initial turn-on times under the control of the memory controller.

11. The memory system of claim 8, wherein the memory controller includes an initial turn-on setting component configured to control the initial turn-on times.

12. The memory system of claim 11, wherein the initial turn-on setting component:
    when the selected page is the first selected page in the read operation, sets the initial turn-on time to a first initial turn-on time; and
    when the selected page is one of the subsequently selected pages, sets the initial turn-on time to a second initial turn-on time, which is shorter than the first initial turn-on time.

13. The memory system of claim 8, wherein the memory device applies a turn-on voltage to word lines and select lines coupled to the plurality of pages in the initial turn-on times.

14. The memory system of claim 8, wherein the initial turn-on time is applied before a read voltage is applied in the read operation.

15. A method for operating a memory system, the method comprising:
    selecting a memory block on which a read operation is to be performed and one page among a plurality of pages in the memory block;
    when the selected page is a first selected page, setting an initial turn-on time to a first time;
    when the selected page is a subsequently selected page, setting the initial turn-on time to a second time; and
    applying a turn-on voltage to the selected page for the first or the second time.

16. The method of claim 15, further comprising, after the turn-on voltage is applied, applying a read voltage to the selected page.

17. The method of claim 15, wherein the first time is longer than the second time.

18. The method of claim 15, wherein a channel of the memory block is electrically coupled to a source line while the turn-on voltage is being applied to the selected page.

19. The method of claim 15, wherein the applying of the turn-on voltage to the selected page comprises applying the turn-on voltage to select word lines of the memory block.

20. The method of claim 16, wherein, after the applying of the read voltage to the selected page, which is not the last selected page, the method is re-performed on a next subsequently selected page by setting the initial turn-on time to the second time.

* * * * *